United States Patent
Watanabe et al.

(10) Patent No.: US 6,951,807 B2
(45) Date of Patent: Oct. 4, 2005

(54) SEMICONDUCTOR DEVICE AND MANUFACTURING METHOD THEREOF

(75) Inventors: Kei Watanabe, Oita (JP); Yukio Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/668,277

(22) Filed: Sep. 24, 2003

(65) Prior Publication Data

US 2004/0072418 A1 Apr. 15, 2004

Related U.S. Application Data

(62) Division of application No. 10/201,892, filed on Jul. 25, 2002, now Pat. No. 6,646,351.

(30) Foreign Application Priority Data

Jul. 30, 2001 (JP) .................................. 2001-230311

(51) Int. Cl.$^7$ .......................................... H01L 21/4763
(52) U.S. Cl. ..................... 438/624; 438/626; 438/629; 438/638
(58) Field of Search ................................ 438/624, 626, 438/633, 634, 629, 638

(56) References Cited

U.S. PATENT DOCUMENTS

| | | | |
|---|---|---|---|
| 5,429,995 A | 7/1995 | Nishiyama et al. | |
| 6,008,120 A | 12/1999 | Lee | |
| 6,057,251 A | 5/2000 | Goo et al. | |
| 6,159,661 A | 12/2000 | Huang et al. | |
| 6,235,633 B1 * | 5/2001 | Jang | 438/675 |
| 6,255,233 B1 | 7/2001 | Smith et al. | |
| 6,391,768 B1 * | 5/2002 | Lee et al. | 438/633 |
| 6,429,105 B1 | 8/2002 | Kunikiyo | |
| 6,437,424 B1 | 8/2002 | Noma et al. | |
| 2001/0006255 A1 | 7/2001 | Kwon et al. | |

FOREIGN PATENT DOCUMENTS

| | | |
|---|---|---|
| JP | 63-177537 | 7/1988 |
| JP | 6-302704 | 10/1994 |
| JP | 3234121 | 9/2001 |

OTHER PUBLICATIONS

Richard Swope, et al., "Improvement of Adhesion Properties of Fluorinated Silica Glass Films by Nitrous Oxide Plasma Treatment," Journal of the Electrochemical Society, vol. 144, No. 7, Jul. 1997, pp. 2559–2564.

Copy of "Notification for Filing Opinion," issued by the Korean Patent Office on May 4, 2005 in counterpart foreign Application No. 10–2002–0044737 and its English translation.

* cited by examiner

Primary Examiner—Michael Trinh
(74) Attorney, Agent, or Firm—Finnegan, Henderson, Farabow, Garrett & Dunner, LLP.

(57) ABSTRACT

A semiconductor device comprises a semiconductor substrate, an interlayer insulating layer formed above the semiconductor substrate, a first metal interconnection embedded in the interlayer insulating layer with a surface thereof exposed to the same plane as a surface of the interlayer insulating layer, a diffusion preventive layer formed on at least the first metal interconnection to prevent diffusion of a metal included in the first metal interconnection, a nitrogen-doped silicon oxide layer formed on the diffusion preventive layer, a fluorine-doped silicon oxide layer formed on the nitrogen-doped silicon oxide layer, and a second metal interconnection embedded in the fluorine-doped silicon oxide layer with a surface thereof exposed to the same plane as a surface of the fluorine-doped silicon oxide layer, and electrically connected to the first metal interconnection.

7 Claims, 6 Drawing Sheets

SEMICONDUCTOR DEVICE AND MANUFACTURING METHOD THEREOF

CROSS-REFERENCE TO RELATED APPLICATIONS

This is a division of Application No. 10/201,892, filed Jul. 25, 2002, now U.S. Pat. No. 6,646,351, which is incorporated herein by reference.

This application is based upon and claims the benefit of priority from the prior Japanese Patent Application No. 2001-230311, filed Jul. 30, 2001, the entire contents of which are incorporated herein by reference.

BACKGROUND OF THE INVENTION

1. Field of the Invention

The present invention relates to a semiconductor device and manufacturing method thereof, and more particularly, to a semiconductor device employing a fluorine-doped silicon oxide layer as an interconnection insulating layer, and a method of manufacturing the same.

2. Description of the Related Art

In prior art semiconductor devices, $SiO_2$ layer has been used as an insulating layer to electrically isolate interconnections. Such an $SiO_2$ layer is primarily produced from source gas, for example, silane ($SiH_4$) and tetraethoxysilane (TEOS) by a low pressure or atmospheric pressure chemical vapor deposition (CVD) technique. Particularly, plasma chemical vapor deposition can produce an $SiO_2$ layer at a low temperature of about 400° C., using TEOS and $O_2$, and the $SiO_2$ layer produced in this way has been widely used. Further, as compared with other thin layer producing methods, the CVD method often uses high purity gas as a reaction source, and provides high quality layers.

However, as microstructure of semiconductor elements has become widespread in recent years, concern about reduction of signal transmission speed has arisen. This implies a problem that reduced interconnection space increases the capacitance between interconnections and reduces signal transmission speed. The reduction in signal transmission speed seems to be one of the negative factors in increasing the performance of semiconductor devices. Therefore, to solve the problem, it is essential to reduce permittivity of the insulating layer formed between interconnections to the lowest possible value.

To reduce the permittivity, in recent years, fluorine-doped silicon oxide or fluorine-doped silicate glass (FSG) has been developed together with the parallel plate CVD technique or high density plasma CVD technique (HDP-CVD). As a method of producing high-density plasma, use of electron cyclotron resonance (ECR) or the inductive coupled plasma (ICP) coil or helicon wave, for example, has been reported.

FIG. 1 shows a sectional view of Cu multi-layer interconnection using a conventional FSG layer. In the same drawing, reference number 81 indicates an FSG layer and likewise, 82 indicates a barrier metal layer, 83 indicates a Cu interconnection in a lower layer, 84 indicates a silicon nitride layer, 85 indicates an FSG layer, 86 indicates another barrier metal layer, 87 indicates a Cu interconnection of an upper layer, 88 indicates another silicon nitride layer and 89 indicates a silicon substrate, respectively. The Cu interconnections 83 and 87 are dual damascene interconnections.

In the FSG layer, as has been reported, the higher the fluorine (F) density, the lower the permittivity, and at the same time, moisture absorption increases. As the moisture absorption of FSG layers 81 and 85 increases, moisture ($H_2O$) is taken into these FSG layers. And, H caused by the moisture reacts with F contained in these FSG layers, and HF is liberated from the FSG layers 81 and 85.

Even if moisture is not taken in, HF is produced from H that is inherently contained in the FSG layer 81. Furthermore, HF is also produced by reaction of hydrogen (H) and moisture ($H_2O$) in silicon nitride layers 84 and 88 with surplus fluorine (F) in FSG layers 81 and 85. FSG layers 81 and 85 and silicon nitride layers 84 and 88 contain H, because gaseous materials such as silane and ammonia containing H are employed as source gas, and this H is mixed into FSG layers 81/85 and silicon nitride layers 84/88.

The above-noted HF will cause corrosion of Cu interconnections 83/87 or barrier metal layers 82/86, and degrade adhesion between Cu interconnections 83/87 and insulating layers 81/84/85/88. Further, this corrosion and deteriorated adhesion will cause more serious problems, for example, layer peeling off, bonding durability decline and decrease in reliability.

As described above, it has been proposed to use an FSG layer in interconnections as an insulating layer with low permittivity, to prevent signal transmission delay. However, there is a problem in using an FSG layer, that is, moisture absorption is high and HF is generated, causing corrosion of interconnection itself or barrier metal layer or peeling off of layers. Thus, a semiconductor device employing fluorine-doped silicon oxide as an insulating layer for interconnections and including multi-layer interconnection to decrease the influence of HF, and a method of manufacturing the same have been expected.

BRIEF SUMMARY OF THE INVENTION

A semiconductor device according to a first aspect of the present invention comprises:

a semiconductor substrate;

an interlayer insulating layer formed above the semiconductor substrate;

a first metal interconnection embedded in the interlayer insulating layer with a surface thereof exposed to substantially the same plane as a surface of the interlayer insulating layer;

a diffusion preventive layer formed on at least the metal interconnection to prevent diffusion of a metal included in the first metal interconnection;

a nitrogen-doped silicon oxide layer formed on the diffusion preventive layer;

a fluorine-doped silicon oxide layer formed on the nitrogen-doped silicon oxide layer; and a second metal interconnection embedded in the fluorine-doped silicon oxide layer with a surface thereof exposed to substantially the same plane as a surface of the fluorine-doped silicon oxide layer, and electrically connected to the first metal interconnection.

A semiconductor device according to a second aspect of the invention comprises:

a semiconductor substrate;

an interlayer insulating layer formed above the semiconductor substrate;

a first metal interconnection embedded in the interlayer insulating layer with a surface thereof exposed to substantially the same plane as a surface of the interlayer insulating layer;

a diffusion preventive layer formed on at least the metal interconnection to prevent diffusion of a metal included in the first metal interconnection;

a first nitrogen-doped silicon oxide layer formed on the diffusion preventive layer;

a fluorine-doped silicon oxide layer formed on the first nitrogen-doped silicon oxide layer;

a second nitrogen-doped silicon oxide layer formed on the fluorine-doped silicon oxide layer; and a second metal interconnection embedded in the fluorine-doped silicon oxide layer with a surface thereof exposed to substantially the same plane as a surface of the second nitrogen-doped silicon oxide layer, penetrating through the second nitrogen-doped silicon oxide layer, and electrically connected to the first metal interconnection.

A semiconductor device manufacturing method according to a third aspect of the invention comprises:

embedding an under interconnection layer in an interlayer insulating layer such that a surface thereof is exposed to substantially the same plane as a surface of the interlayer insulating layer;

forming a diffusion preventive layer to prevent diffusion of a metal included in the under interconnection layer, on at least the under interconnection layer;

forming a first nitrogen-doped silicon oxide layer on the diffusion preventive layer;

forming a fluorine-doped silicon oxide layer on the nitrogen-doped silicon oxide layer;

forming an interconnection groove and a via hole extending from a bottom of the interconnection groove above the under interconnection layer in the fluorinedoped silicon oxide layer; and forming a plug in the via hole with a metal layer, to be in electrically contact with the under interconnection layer, and an upper interconnection layer in the interconnection groove with the metal layer, to be electrically contact with the plug.

DETAILED DESCRIPTION OF THE INVENTION

Hereinafter embodiments of the present invention will be explained with reference to the accompanying drawings.

(First Embodiment)

FIGS. 2A–2F are sectional views illustrating the steps of manufacturing Cu multi-layer interconnection in accordance with a first embodiment.

Figure 2A:
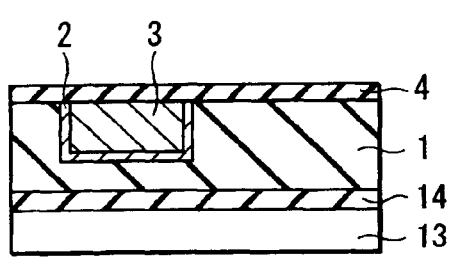
FIGS. 2A–2F are sectional views illustrating the steps of manufacturing Cu multi-layer interconnection in accordance with a first embodiment.

FIG. 2A illustrates in cross section a first Cu interconnection structure formed by a known damascene process. The first Cu interconnection structure comprises a first interlayer insulating layer 1 with an interconnection groove on its surface, a first barrier metal layer 2 covering the bottom and sides of the interconnection groove, a first Cu interconnection (under interconnection layer) 3 embedded in the interconnection groove, and a first silicon nitride layer 4 formed as a Cu diffusion preventive layer on the first interlayer insulating layer 1.

The above first Cu interconnection structure is formed on an Si wafer 13. The interlayer insulating layer 1 is an FSG layer, for example. In this case, it is desirable to form a nitrogen-doped silicon oxide layer 14 between the interlayer insulating layer 1 and Si wafer 13. The nitrogen-doped silicon oxide layer 14 precludes moisture supposed to be contained in the Si wafer 13 from penetrating into the FSG layer 1.

In addition, it is more desirable to form a nitrogen-doped silicon oxide layer between the interlayer insulating layer 1 and the first silicon nitride layer 4 (Cu diffusion preventive layer). In this case, the nitrogen-doped silicon oxide layer improves the adhesion strength between the interlayer insulating layer 1 and the first silicon nitride layer 4.

Figure 2B:
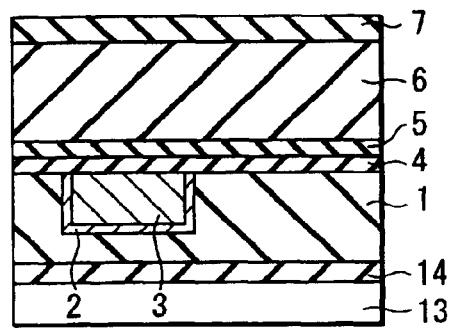

Next, as shown in FIG. 2B, a first nitrogen-doped silicon oxide layer (hereinafter noted SiON layer) 5 is formed on the first silicon nitride layer 4.

Figure 1:
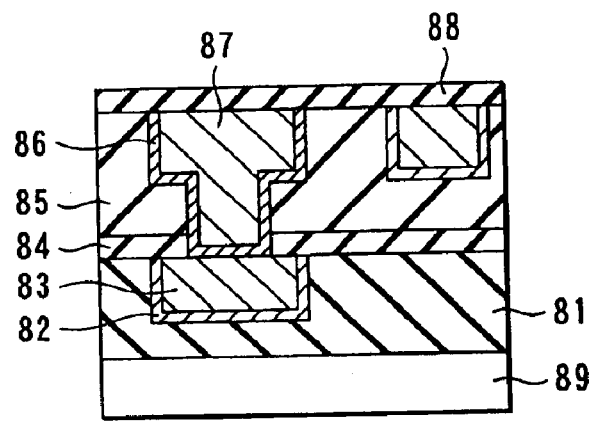
FIG. 1 is a sectional view of Cu multi-layer interconnection employing a conventional FSG layer.
Figure 3:
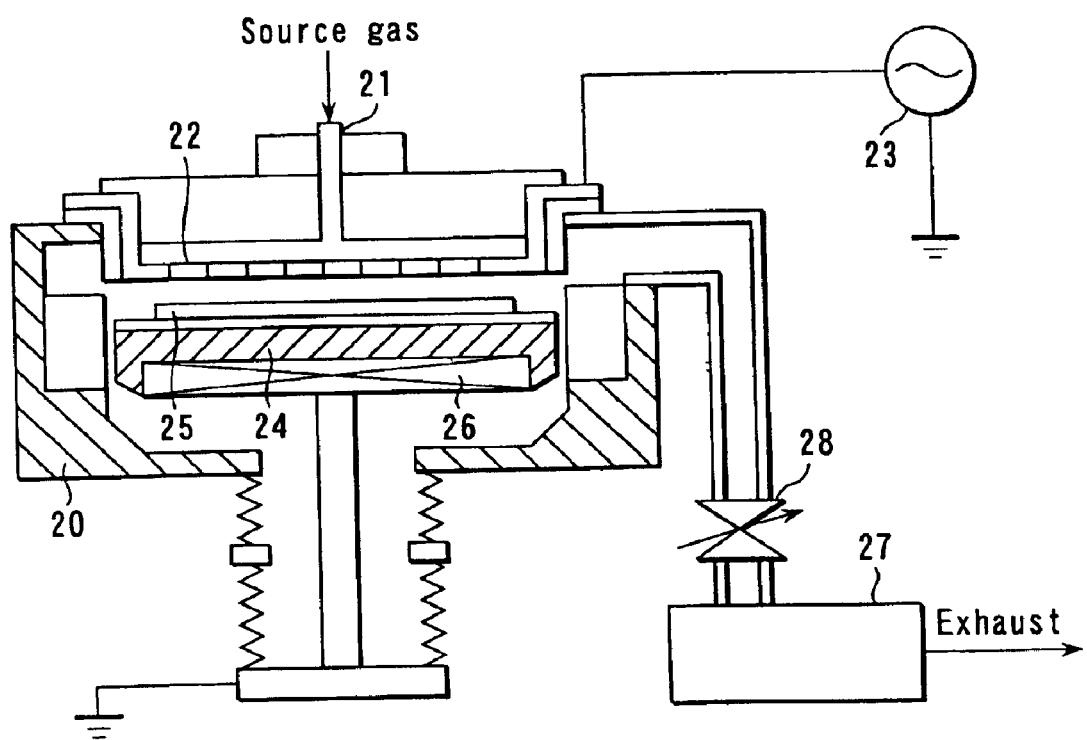
FIG. 3 is a perspective view showing a parallel plate CVD system used for manufacturing the Cu multi-layer interconnection in the first embodiment.

The SiON layer 5 is formed by means of a parallel plate CVD system, for example, shown in FIG. 3. In FIG. 3, denoted at 20 is a reaction chamber made of metal such as aluminum (Al). Formed at the top of the reaction chamber 20 is a source gas inlet 21 to introduce source gas such as $SiH_4$, $SiF_4$, $N_2O$, $N_2$ and $NH_3$ into the chamber. The source gas is controlled in flow rate with a massflow controller (MFC) (not shown), and dispersed uniformly through a gas dispersion plate 22, and supplied into the reaction chamber 20.

The gas dispersion plate 22 serves also as a radio frequency (RF) electrode, and is connected to one end of a radio frequency (RF) power supply 23. The other end of the RF power supply 23 is grounded. By supplying electric power to the RF power supply 23, capacitive coupling occurs, and electric power is supplied to the space in the reaction chamber 20, and plasma is produced.

A substrate grounding electrode 24 can hold an Si wafer 25 as a susceptor, and is supported by a lift mechanism so as to control the distance between the S-wafer 25 and the gas dispersion plate 22 which acts as an upper electrode. Further, the substrate grounding electrode 24 includes a heater 26 to control the temperature of the Si wafer 25 up to about 450° C.

Also connected to the reaction chamber 20 is a dry pump 27 which evacuates the chamber 20 and regulates the pressure in the chamber 20 through a throttle valve 28.

Description will now be given on the method of creating an SiON layer 5 by using the aforementioned parallel plate CVD system.

First, an Si wafer 25 is introduced into the reaction chamber 20, and held on the substrate grounding electrode 24. Next, source gas, for example, $SiH_4$ gas of 50 SCCM, $N_2O$ of 500 SCCM and $N_2$ of 3000 SCCM are led into the reaction chamber 20, and then the pressure in the chamber 20 is regulated to approximately 400 Pa (=3 torr). And, when the pressure and gas flow rate become stable, electric power of 350 watts is supplied to the RF power supply 23. An SiON layer 5 with a thickness of 10–100 nm will be formed.

Next, as shown in FIG. 2B, an FSG layer 6 is formed on the SiON layer 5. A concrete method of forming the FSG layer 6 will be explained below.

First, an Si wafer 25 is placed in and held on the substrate grounding electrode 24 in the reaction chamber 20 of the parallel plate CVD system shown in FIG. 3. Next, source gas, for example, $SiH_4$ gas of 100 SCCM, $N_2O$ of 2500 SCCM and $SiF_4$ of 200 SCCM are introduced into the reaction chamber 20, and then the pressure in the chamber 20 is regulated to approximately 667 Pa (=5 torr). And, when the pressure and gas flow rate become stable, electric power of 1500 watts is supplied to the RF power supply 23. An FSG layer with a fluorine density of 4–12 atomic % and thickness of 100–1500 nm will be formed to match a desired interlayer thickness.

Finally, a second SiON layer 7 is formed on the FSG layer 6. A concrete method of forming the SiON layer 7 will be explained below.

First, an Si wafer 25 is placed in and held on the substrate grounding electrode 24 in the reaction chamber 20 of the parallel plate CVD system shown in FIG. 3. Next, source gas, for example, $SiH_4$ gas of 50 SCCM, $N_2O$ of 500 SCCM and $N_2$ of 3000 SCCM are introduced into the reaction chamber 20, and then the pressure in the chamber 20 is regulated to approximately 400 Pa (=3 torr). And, when the pressure and gas flow rate become stable, electric power of 350 watts is supplied to the RF power supply 23. An SiON layer 7 with a thickness of 200–300 nm will be formed.

Figure 2C:
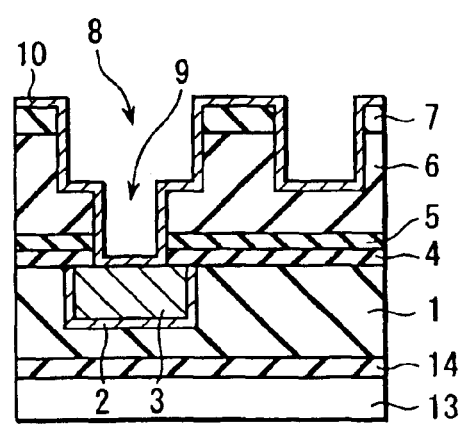

Next, as shown in FIG. 2C, an interlayer insulating layer for a silicon nitride layer 4, SiON layer 5, FSG layer 6 and SiON layer 7 is processed by known photolithography and reactive ion etching (RIE), thereby forming an interconnection groove 8 on the surfaces of the interlayer insulating layers 4–7, and a via hole 9 is formed to connect the bottom of interconnection groove 8 to the surface of Cu interconnection 3. The interconnection groove 8 runs through the SiON layer 7, and the bottom of the interconnection groove 8 presents in the FSG layer 6.

No particular order is specified in forming the interconnection groove 8 and via hole 9. When the via hole 9 is formed first, a photoresist pattern having a window for the via hole 9 shall be formed on the SiON layer 7, and through this pattern as a mask, reactive ion etching (RIE) is enforced on the interlayer insulating layers 4–7, whereby a via hole 9 is formed. Next, the above photo resist pattern is stripped off, a resist pattern having a window for the interconnection groove 8 is formed on the SiON layer 7, and through this pattern as a mask, reactive ion etching (RIE) is performed on the FSG layer 6 and SiON layer 7, whereby an interconnection groove 8 is formed.

Figure 2D:
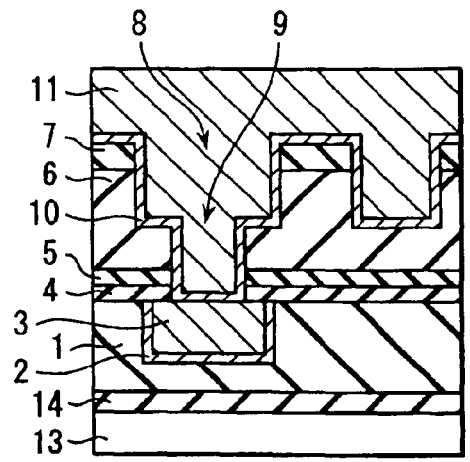

Next, as shown in FIGS. 2C and 2D, a second barrier metal layer 10 is deposited to cover all over the surface of the interconnection groove 8 and via hole 9, and a via plug and Cu layer 11 as an interconnection layer are formed so as to fill up the interior in the interconnection groove 8 and via hole 9.

A second barrier metal layer 10 is formed by sputtering or metal organic CVD (MOCVD), for example. The Cu layer 11 is, on the other hand, is formed by forming a Cu thin film as a plating seed by the sputtering technique, and a Cu film, as interconnection itself, is piled up to a desired thickness on the Cu thin film by using a plating technique.

Figure 2E:
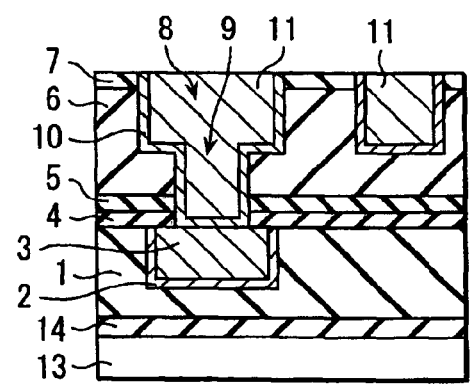

Finally, as shown in FIG. 2E, the Cu layer 11 and barrier metal layer 10 formed outside the interconnection groove 8 and via hole 9 are removed by chemical mechanical polishing (CMP) to flatten the surface of the structure. The thickness of residual Cu layer 11 is 200–1000 nm. In this way, a second interconnection (upper interconnection layer) 11 and an inter-line via plug which electrically connects the first Cu interconnection 3 to the second Cu interconnection 11 are completed. In this arrangement, the Cu interconnection 11 is dual damascene interconnection, but it may also be so called single damascene interconnection. Likewise, the Cu interconnection 3 may be either dual damascene interconnection or single damascene interconnection. In the CMP based process of removing the Cu layer 11 and barrier metal layer 10 formed outside the interconnection groove 8 and via hole 9, considering a polishing margin and the like on the wafer surface, it is allowable to remove a part of the SiON layer 7.

Figure 2F:
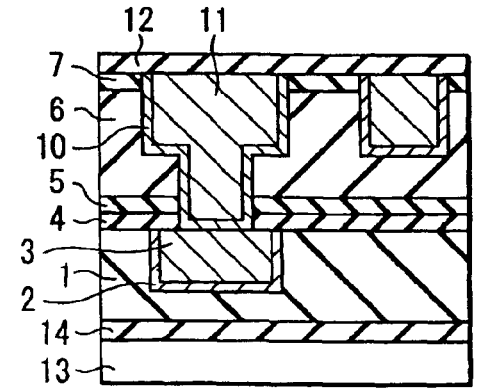

Thereafter, as shown in FIG. 2F, a second silicon nitride layer 12, as a Cu diffusion preventive layer, is formed on the SiON layer 7, barrier metal layer 10 and Cu interconnection 11.

Figure 4A:
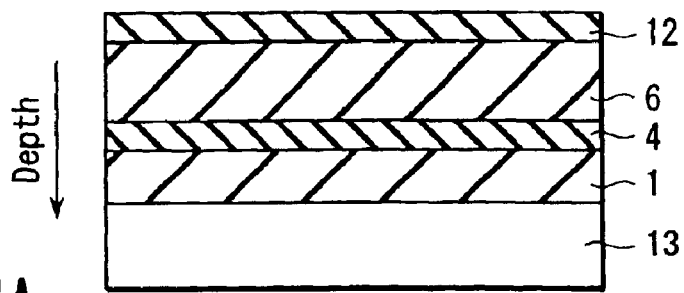
FIG. 4A is a sectional view of a conventional multi-layer substrate not including an SiON layer.
Figure 4B:
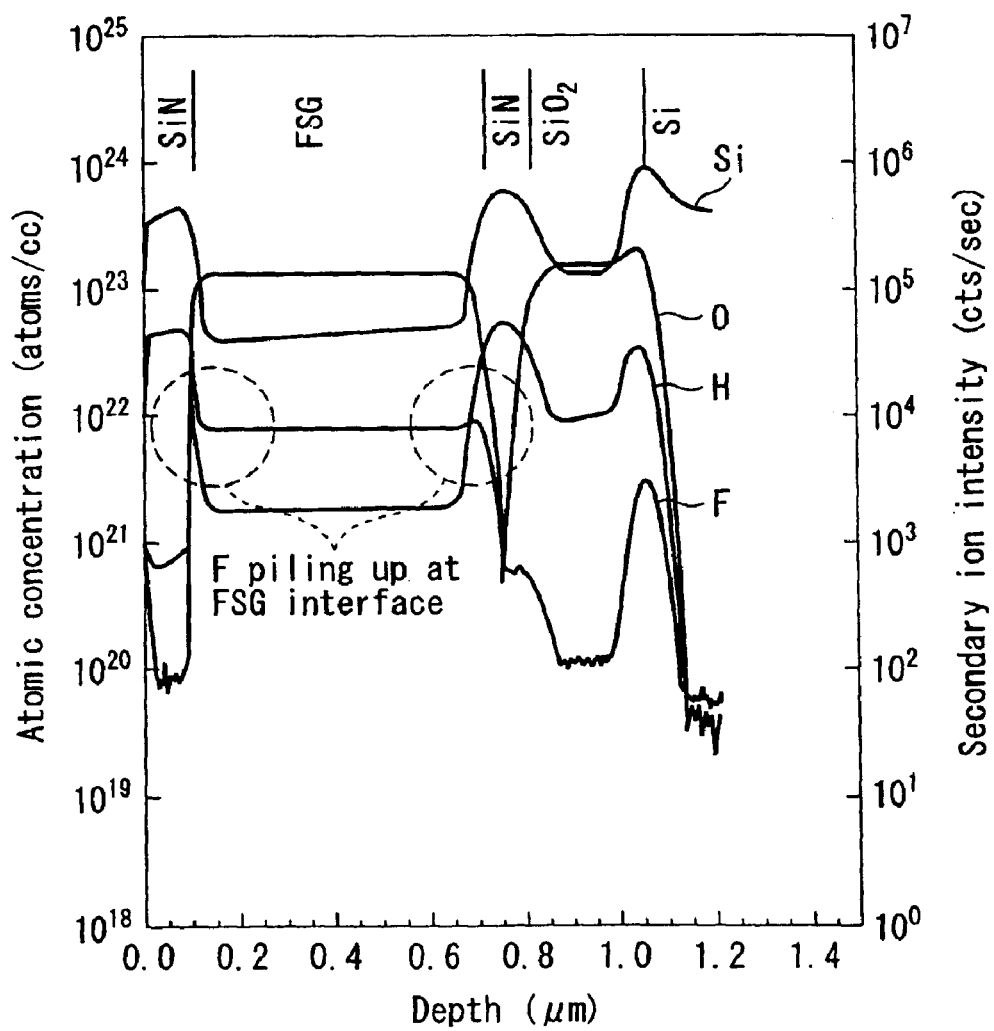
FIG. 4B is a graph showing a diffusion profile of Si, H, F and O when a specimen shown in FIG. 4A is heated in an annealing furnace in atmosphere of $N_2$ gas at atmospheric pressure.
Figure 5A:
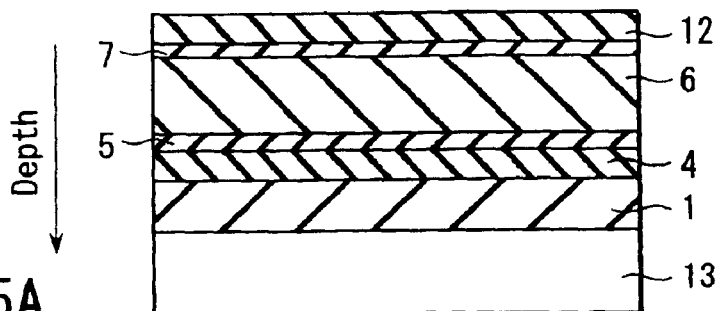
FIG. 5A is a sectional view of a multi-layer substrate including an SiON layer of the first embodiment.
Figure 5B:
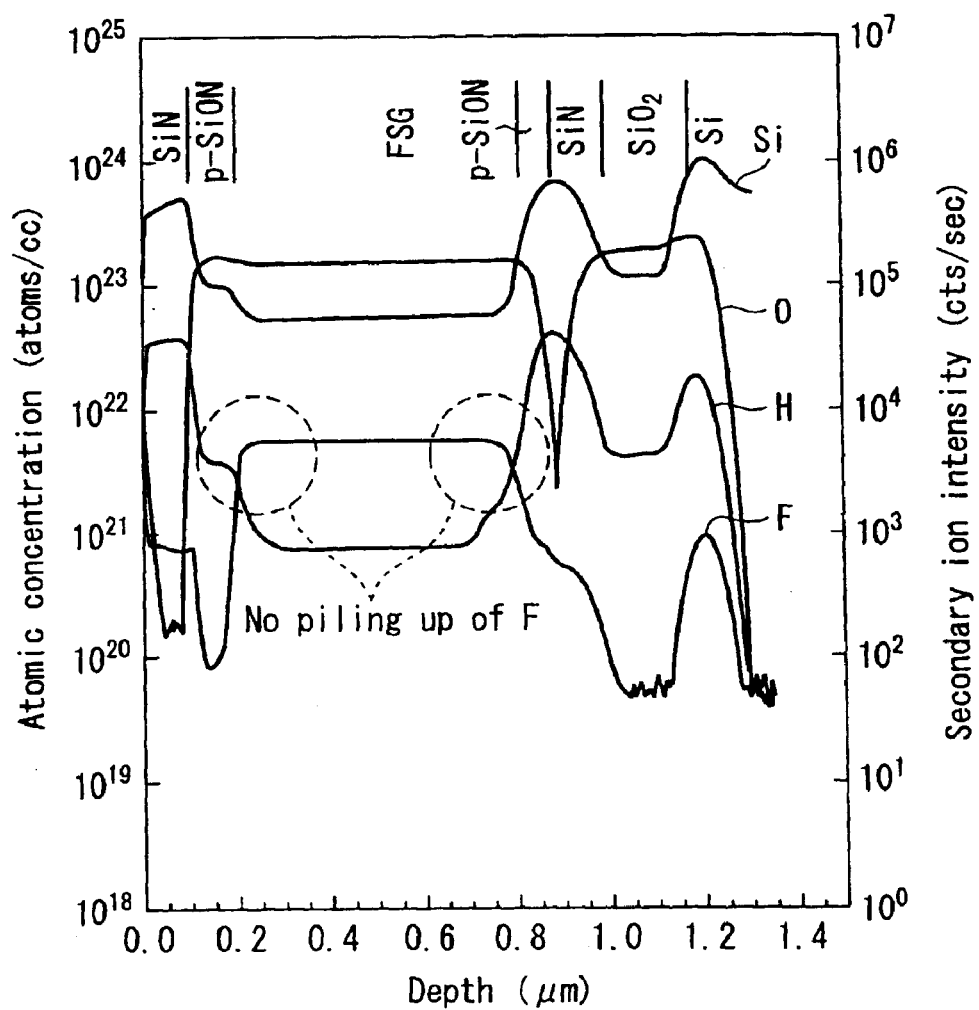
FIG. 5B is a graph showing a diffusion profile of Si, H, F and O when a specimen shown in FIG. 5A is heated in an annealing furnace in atmosphere of $N_2$ gas at atmospheric pressure.

FIGS. 4B and 5B graphically show diffusion profiles of Si, H, F and O, respectively, when a specimen not including SiON layer (prior art) and a specimen including SiON layer (the embodiment discussed here) are heated for 2 hours in an annealing furnace at 450° C. in atmosphere of $N_2$ gas at atmospheric pressure. In this time, the refractive indexes of SiON layers 5 and 7 measured with a He—Ne laser of 633 nm are 1.52. FIGS. 4A and 5A show sectional views of these specimens, respectively. In these figures, the same reference numbers are given to the same components as those in FIG. 2.

With the specimen not including SiON layers 5 and 7 (FIGS. 4A and 4B), pile-up of high concentration F is seen in the interfaces between silicon nitride layers 4/12 and FSG layer 6. This is caused by that free fluorine (F) contained in the FSG layer 6 moves to the interfaces during the heating process.

Conversely, with the specimen including SiON layers 5 and 7 (FIGS. 5A and 5B), pile-up of high concentration F is not seen in the interfaces between silicon nitride layers 4/12 and SiON layers 5/7 and the interfaces between SiON layers 5/7 and FSG layer 6. This is caused by free fluorine (F) contained in the FSG layer 6 diffusing to SiON layers 5 and 7, which are upper and lower layers, and remains thereon.

Therefore, according to the first embodiment, free fluorine (F) contained in the FSG layer 6 can be sufficiently absorbed into SiON layers 5 and 7, and the amount of HF produced as a result of chemical reaction of fluorine (F) and hydrogen (H) can be substantially decreased. This contributes to prevent corrosion of Cu interconnections 3/11 and barrier metal layers 2/10 formed on the FSG layer 6. This also prevents deterioration of adhesion of the Cu interconnections 11 and barrier metal layer 10 to the insulating layers 4, 5, 6, 7 and 12, as well as preventing peeling off of layers during the CMP process in FIG. 2E and the processes involving the heating step. The processes involving a heating step include, for example, annealing to increase grain size in the Cu interconnections 3/11, heating involved in the step of forming an insulating layer which is formed after the Cu interconnection 11, annealing to regulate the threshold voltage of MOS transistors, and so on.

Figure 6:
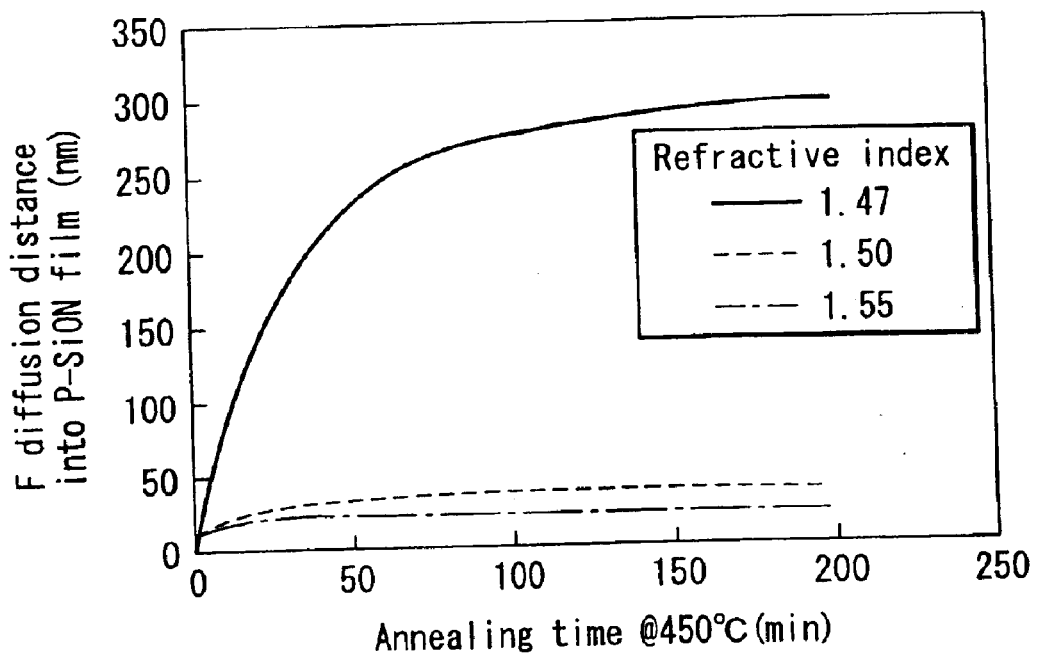
FIG. 6 is a graph showing a relationship between a refractive index of an SiON layer measured with a He—Ne laser of 633 nm and a diffusion distance of fluorine heated in an annealing furnace in atmosphere of N2 gas at atmospheric pressure.

FIG. 6 graphically shows a refractive index of SiON layers 5 and 7 measured with an He-Ne laser of 633 nm and a diffusion fluorine layer thickness when heated for 0–20 minutes in an annealing furnace at 450° C. in an atmosphere of $N_2$ gas at atmospheric pressure.

It will be apparent from FIG. 6 that when the refractive index of SiON layers 5/7 is 1.4, namely, the refractive index is low, the F diffusion distance increases. This may be caused by surplus free fluorine (F) not being sufficiently absorbed. As the F diffusion distance increases, the adhesion decreases. On the other hand, it is seen that when the refractive index is 1.50 or higher, the F diffusion distance becomes sufficiently small. Therefore, it is desirable to set the refractive index of SiON layer 5/7 to 1.50 or higher.

In addition, when the refractive index of SiON layers 5/7 is high, the permittivity of SiON layers 5/7 increases. This induces the increased capacitance between interconnections and between interconnection layers, and delays the operating speed of a semiconductor device. Therefore, it is desirable to set the refractive index of SiON layers 5/7 to 1.55 or lower.

Figure 7:
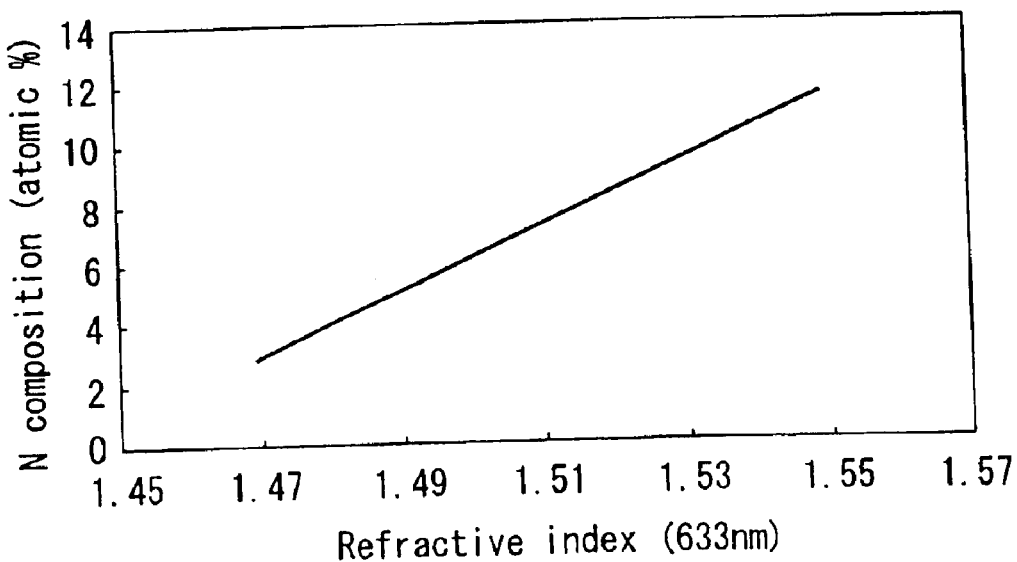
FIG. 7 is a graph showing a relationship between a refractive index and N composition of an SiON layer.

FIG. 7 graphically shows a relationship between the refractive index and N composition of an SiON layer, which is determined by X-ray photoelectron spectroscopy (XPS). It is seen from FIG. 7 that the refractive index 1.50 corresponds to the N composition 6 and the index 1.55 corresponds to the N composition 10.5 (atomic %), respectively. Therefore, to produce an SiON layer with a refractive index 1.50–1.55, it is necessary to create an SiON layer with a nitride density of 6–10.5 atomic % by controlling nitride or other materials used.

Thereafter, the steps of forming the interlayer insulating layers 5–12, barrier metal layer 10 and Cu interconnection 11 are repeated to create a multilayer Cu interconnection comprising 4 to 8 layers, whereby the adhesion between of the Cu interconnection 11 and barrier metal layer 10 to the interlayer insulating layers 5–12 is improved, and a semiconductor device with ensured heat stability and mechanical strength is realized.

(Second Embodiment)

FIGS. 8A–8D are sectional views illustrating a method of manufacturing a multi-layer Cu interconnection according to a second embodiment. In these figures, like reference numerals indicate corresponding parts in FIGS. 2A–2F, and detail explanation is omitted. Only the difference of the second embodiment from the first embodiment is that a second SiON layer 7 is present during manufacturing, but is eliminated in the final structure.

Figure 8A:
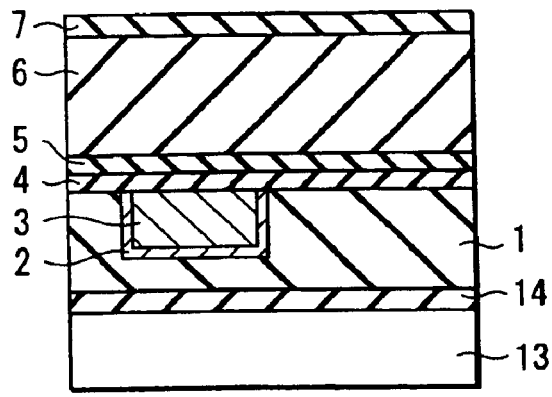
FIGS. 8A–8D are sectional views illustrating the steps of manufacturing Cu multi-layer interconnection in accordance with a second embodiment.

First, as shown in FIG. 8A, SiON layer 5, FSG layer 6 and SiON layer 7 are formed on a first silicon nitride layer 4, as in the first embodiment. Method, system and conditions for forming these layers 5–7 are the same as those in the first embodiment, except the thickness of SiON layer 7 is 50–100 nm while 200–300 nm in the first embodiment.

Figure 8B:
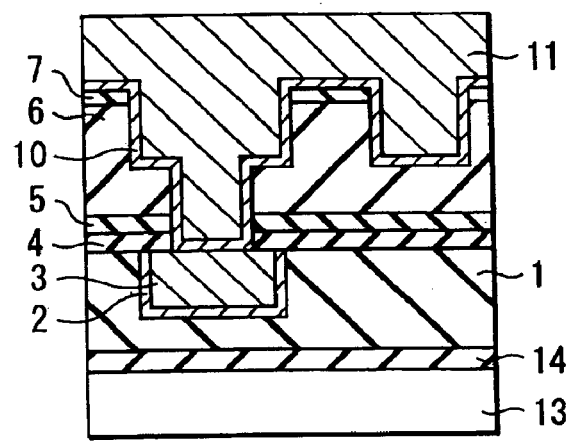

Next, as shown in FIG. 8B, the interconnection groove 8, via hole 9, barrier metal layer 10 and Cu layer 11 are formed, as in the first embodiment. As the SiON layer 7 is 50–100 nm thick, it is easy, as compared with the first embodiment, to process the insulating layer which forms the interconnection groove 8 and via hole 9, and the embedding of Cu layer 1 into the interconnection groove 8 and via hole 9 is also easy.

Figure 8C:
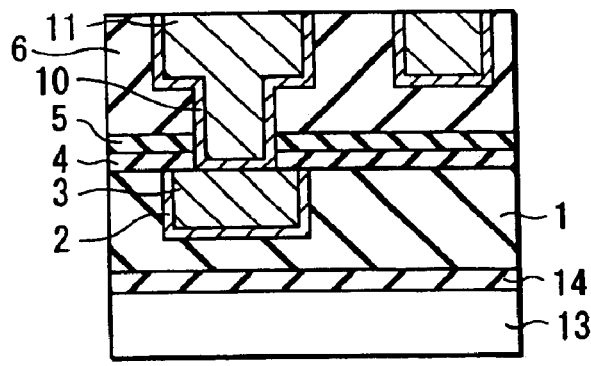

Next, as shown in FIG. 8C, the Cu layer 11, barrier metal layer 10 and SiON layer 7 formed outside the interconnection groove 8 and via hole 9 are removed by the CMP technique to flatten the surface of the structure. As the SiON layer 7 is as thin as 50–100 nm, the removal of this layer is easy.

Figure 8D:
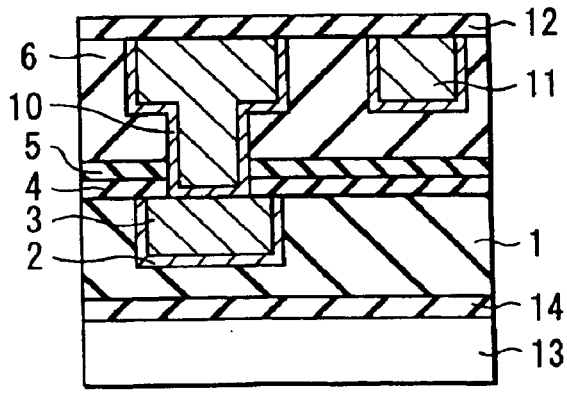

Next, as shown FIG. 8D, silicon nitride layer 12 is formed on FSG layer 7, barrier metal layer 10 and Cu interconnection 11. After this, as in the first embodiment, the steps of forming the interlayer insulating layers 5–12, barrier metal layer 10 and Cu interconnection 11 are repeated to create a multi-layer Cu interconnection comprising 4 to 8 layers.

In accordance with the present embodiment, unwanted capacitance increase between interconnections or between interconnection layers can be effectively suppressed. Additionally, the same effects as in the first embodiment can be obtained. The SiON layer 7 may be omitted unless peeling-off due to moisture absorption after being left is expected.

The invention is not to be limited by the embodiments described herein. For example, in the embodiments, Cu interconnection is discussed, but it may alternatively be Al or another metal interconnection.

Note that Al interconnection processed by RIE is surrounded by SiON with high permittivity, and if spacing in adjacent interconnections is limited, the interline effective permittivity (Keff) becomes relatively high. Therefore, when spacing is limited in the interconnections, it is advantageous from the viewpoint of interline permittivity to employ Cu damascene interconnection whose upper surface is covered by an SiON layer or SiN layer.

Further, as a diffusion preventive layer, a silicon carbide layer may be used instead of a silicon nitride layer. Also, the Si wafer may be replaced by other semiconductor wafers such as SOI and SiGe wafers.

As described in detail above, the present invention realizes a semiconductor device which includes a multi-layer interconnection employing a fluorine-doped silicon oxide layer as an insulating layer between interconnections to reduce the influence of HF, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method, comprising:

embedding an under interconnection layer in an interlayer insulating layer such that a surface thereof is exposed to substantially the same plane as a surface of said interlayer insulating layer;

forming a diffusion preventive layer to prevent diffusion of a metal included in said under interconnection layer, on at least said under interconnection layer;

forming a first nitrogen-doped silicon oxide layer on said diffusion preventive layer so as to have a substantially constant refractive index falling in a range between 1.50 (inclusive) and 1.55 (inclusive) throughout said first nitrogen-doped silicon oxide layer;

forming a fluorine-doped silicon oxide layer on said nitrogen-doped silicon oxide layer;

forming an interconnection groove and a via hole extending from a bottom of said interconnection groove above said under interconnection layer in said fluorine-doped silicon oxide layer; and forming a plug in said via hole with a metal layer, to be in electrical contact with said under interconnection layer, and an upper interconnection layer in said interconnection groove with said metal layer, to be in electrical contact with said plug.

2. The semiconductor device manufacturing method according to claim 1, wherein said forming a first nitrogen-doped silicon oxide layer on said diffusion preventive layer includes setting a nitrogen concentration of said first nitrogen-doped silicon oxide layer to be 6 atomic % or more and 10.5 atomic % or less.

3. The semiconductor device manufacturing method according to claim 1, further comprising forming another diffusion preventive layer on at least said upper interconnection layer to prevent diffusion of a metal included in said upper interconnection layer.

4. The semiconductor device manufacturing method according to claim 1, wherein said interlayer insulating layer comprises a fluorine-doped silicon oxide layer.

5. The semiconductor device manufacturing method according to claim 1, further comprising, after said forming a fluorine-doped silicon oxide layer on said first nitrogen-doped silicon oxide layer, forming a second nitrogen-doped silicon oxide layer on said fluorine-doped silicon oxide layer so as to have a substantially constant refractive index falling in a range between 1.50 (inclusive) and 1.55 (inclusive) throughout said second nitrogen-doped silicon oxide layer, wherein said forming an interconnection groove in said fluorine-doped silicon oxide layer includes forming said interconnection groove to penetrate said second nitrogen-doped silicon oxide layer.

6. The semiconductor device manufacturing method according to claim 5, wherein said forming a plug in said via hole and an upper interconnection layer in said interconnection groove includes forming said metal layer on said second nitrogen-doped silicon oxide layer having said interconnection groove and said via hole, with a thickness sufficient to fill up an interior of said interconnection groove and said via hole, followed by removing said metal layer over said second nitrogen-doped silicon oxide layer.

7. The semiconductor device manufacturing method according to claim 6, wherein said forming a plug in said via hole and an upper interconnection layer in said interconnection groove further includes removing said second nitrogen-doped silicon oxide layer and said metal layer formed over said fluorine-doped silicon oxide layer, after said removing said metal layer over said second nitrogen-doped silicon oxide layer.

* * * * *